(12) United States Patent
Barrus

(10) Patent No.: US 9,552,382 B2
(45) Date of Patent: Jan. 24, 2017

(54) REFERENCE COUNTER INTEGRITY CHECKING

(71) Applicant: Frank E. Barrus, New Ipswich, NH (US)

(72) Inventor: Frank E. Barrus, New Ipswich, NH (US)

(73) Assignee: Exablox Corporation, Sunnyvale, CA (US)

( * ) Notice: Subject to any disclaimer, the term of this patent is extended or adjusted under 35 U.S.C. 154(b) by 157 days.

(21) Appl. No.: 14/257,905

(22) Filed: Apr. 21, 2014

(65) Prior Publication Data
US 2014/0317065 A1   Oct. 23, 2014

Related U.S. Application Data

(60) Provisional application No. 61/815,215, filed on Apr. 23, 2013.

(51) Int. Cl.
*G06F 17/00* (2006.01)
*G06F 17/30* (2006.01)
(Continued)

(52) U.S. Cl.
CPC ..... *G06F 17/30303* (2013.01); *G06F 12/0253* (2013.01); *G06F 12/0261* (2013.01); *G06F 17/5022* (2013.01)

(58) Field of Classification Search
CPC ................................................ G06F 17/30303
See application file for complete search history.

(56) References Cited

U.S. PATENT DOCUMENTS

| 4,656,604 A | 4/1987 | van Loon |
| 4,660,130 A | 4/1987 | Bartley et al. |

(Continued)

FOREIGN PATENT DOCUMENTS

| EP | 1285354 | 2/2003 |
| EP | 2575379 | 4/2013 |

(Continued)

OTHER PUBLICATIONS

Non-Final Office Action, Jun. 24, 2015, U.S. Appl. No. 13/441,592, filed Apr. 6, 2012.

(Continued)

*Primary Examiner* — Sherief Badawi
*Assistant Examiner* — Lahcen Ennaji
(74) *Attorney, Agent, or Firm* — Carr & Farrell LLP

(57) ABSTRACT

Disclosed is a method for checking the integrity of a reference counter for objects in a file system. A unique identifier can be associated with the reference referring to the object. A reference check can be associated with the object and set to a predefined initial value before any references referring to the object are added. When a new reference referring to the object is added, the reference counter is increased by one and the identifier associated with the new reference is added to the reference check. When an existing reference referring to the object is about to be removed, the reference counter is decreased by one and the identifier associated with the existing reference is subtracted from the reference check. If the reference check is not equal to the initial value when the reference counter is zero, then an error message is sent to the file system.

20 Claims, 6 Drawing Sheets

(51) Int. Cl.
   *G06F 12/02* (2006.01)
   *G06F 17/50* (2006.01)

(56) References Cited

U.S. PATENT DOCUMENTS

| | | |
|---|---|---|
| 5,420,999 A | 5/1995 | Mundy |
| 5,561,778 A | 10/1996 | Fecteau et al. |
| 5,950,205 A | 9/1999 | Aviani, Jr. |
| 6,098,079 A | 8/2000 | Howard |
| 6,154,747 A | 11/2000 | Hunt |
| 6,167,437 A | 12/2000 | Stevens et al. |
| 6,314,435 B1 | 11/2001 | Wollrath et al. |
| 6,356,916 B1 | 3/2002 | Yamatari et al. |
| 6,480,950 B1 | 11/2002 | Lyubashevskiy et al. |
| 6,772,162 B2 | 8/2004 | Waldo et al. |
| 6,839,823 B1 | 1/2005 | See et al. |
| 7,043,494 B1 | 5/2006 | Joshi et al. |
| 7,177,980 B2 | 2/2007 | Milillo et al. |
| 7,197,622 B2 | 3/2007 | Torkelsson et al. |
| 7,266,555 B1 | 9/2007 | Coates et al. |
| 7,293,140 B2 | 11/2007 | Kano |
| 7,392,421 B1 | 6/2008 | Bloomstein et al. |
| 7,403,961 B1 | 7/2008 | Deepak et al. |
| 7,454,592 B1 | 11/2008 | Shah et al. |
| 7,509,360 B2 | 3/2009 | Wollrath et al. |
| 7,539,836 B1 | 5/2009 | Klinkner |
| 7,685,109 B1 | 3/2010 | Ransil et al. |
| 7,725,437 B2 | 5/2010 | Kirshenbaum et al. |
| 7,827,218 B1 | 11/2010 | Mittal |
| 7,895,666 B1 | 2/2011 | Eshghi et al. |
| 7,990,979 B2 | 8/2011 | Lu et al. |
| 8,019,882 B2 | 9/2011 | Rao et al. |
| 8,099,605 B1 | 1/2012 | Billsrom et al. |
| 8,132,168 B2 | 3/2012 | Wires et al. |
| 8,195,623 B2 | 6/2012 | Prahlad et al. |
| 8,239,584 B1 | 8/2012 | Rabe et al. |
| 8,364,887 B2 | 1/2013 | Wong et al. |
| 8,407,438 B1 | 3/2013 | Ranade |
| 8,447,733 B2 | 5/2013 | Sudhakar |
| 8,515,911 B1 | 8/2013 | Zhou et al. |
| 8,572,290 B1 | 10/2013 | Mukhopadhyay et al. |
| 8,868,926 B2 | 10/2014 | Hunt et al. |
| 9,009,202 B2 | 4/2015 | Patterson |
| 9,043,567 B1 | 5/2015 | Modukuri et al. |
| 9,235,479 B1 | 1/2016 | Muntz et al. |
| 2002/0069340 A1 | 6/2002 | Tindal et al. |
| 2002/0087590 A1 | 7/2002 | Bacon et al. |
| 2003/0028514 A1 | 2/2003 | Lord et al. |
| 2003/0028585 A1 | 2/2003 | Yeager et al. |
| 2003/0056139 A1* | 3/2003 | Murray ............... G06F 11/1451 714/4.1 |
| 2003/0072259 A1 | 4/2003 | Mor |
| 2003/0101173 A1 | 5/2003 | Lanzatella et al. |
| 2003/0115408 A1 | 6/2003 | Milillo et al. |
| 2004/0093361 A1 | 5/2004 | Therrien et al. |
| 2004/0111610 A1 | 6/2004 | Slick et al. |
| 2004/0158588 A1 | 8/2004 | Pruet |
| 2004/0167898 A1* | 8/2004 | Margolus .......... G06F 17/30368 |
| 2005/0071335 A1* | 3/2005 | Kadatch ............ G06F 17/30949 |
| 2005/0080928 A1 | 4/2005 | Beverly et al. |
| 2005/0081041 A1 | 4/2005 | Hwang |
| 2005/0083759 A1 | 4/2005 | Wong et al. |
| 2005/0138271 A1 | 6/2005 | Bernstein et al. |
| 2005/0160170 A1 | 7/2005 | Schreter |
| 2005/0256972 A1 | 11/2005 | Cochran et al. |
| 2006/0039371 A1 | 2/2006 | Castro et al. |
| 2006/0083247 A1 | 4/2006 | Mehta |
| 2006/0156396 A1 | 7/2006 | Hochfield et al. |
| 2006/0271540 A1 | 11/2006 | Williams |
| 2006/0271604 A1 | 11/2006 | Shoens |
| 2007/0005746 A1 | 1/2007 | Roe et al. |
| 2007/0130232 A1 | 6/2007 | Therrien et al. |
| 2007/0179997 A1 | 8/2007 | Nooning |
| 2007/0203960 A1* | 8/2007 | Guo .................... G06F 12/0269 |
| 2007/0230368 A1 | 10/2007 | Shi et al. |
| 2007/0233828 A1 | 10/2007 | Gilbert |
| 2007/0271303 A1 | 11/2007 | Menendez et al. |
| 2007/0276838 A1 | 11/2007 | Abushanab et al. |
| 2007/0276843 A1 | 11/2007 | Lillibridge et al. |
| 2008/0005624 A1 | 1/2008 | Kakivaya et al. |
| 2008/0016507 A1 | 1/2008 | Thomas et al. |
| 2008/0052446 A1 | 2/2008 | Lasser et al. |
| 2008/0126434 A1 | 5/2008 | Uysal et al. |
| 2008/0133893 A1 | 6/2008 | Glew |
| 2008/0147872 A1 | 6/2008 | Regnier |
| 2008/0170550 A1 | 7/2008 | Liu et al. |
| 2008/0183973 A1 | 7/2008 | Aguilera et al. |
| 2008/0243879 A1 | 10/2008 | Gokhale et al. |
| 2008/0243938 A1 | 10/2008 | Kottomtharayil et al. |
| 2008/0244199 A1 | 10/2008 | Nakamura et al. |
| 2008/0292281 A1 | 11/2008 | Pecqueur et al. |
| 2009/0049240 A1 | 2/2009 | Oe et al. |
| 2009/0100212 A1 | 4/2009 | Boyd et al. |
| 2009/0172139 A1 | 7/2009 | Wong et al. |
| 2009/0198927 A1 | 8/2009 | Bondurant et al. |
| 2009/0199041 A1 | 8/2009 | Fukui et al. |
| 2009/0307292 A1 | 12/2009 | Li et al. |
| 2009/0327312 A1 | 12/2009 | Kakivaya et al. |
| 2010/0023941 A1 | 1/2010 | Iwamatsu et al. |
| 2010/0031000 A1 | 2/2010 | Flynn et al. |
| 2010/0036862 A1* | 2/2010 | Das .................. G06F 17/30917 707/698 |
| 2010/0114336 A1 | 5/2010 | Konieczny et al. |
| 2010/0114905 A1 | 5/2010 | Slavik et al. |
| 2010/0122330 A1 | 5/2010 | McMillan et al. |
| 2010/0161817 A1 | 6/2010 | Xiao et al. |
| 2010/0172180 A1 | 7/2010 | Paley et al. |
| 2010/0191783 A1 | 7/2010 | Mason et al. |
| 2010/0217953 A1 | 8/2010 | Beaman et al. |
| 2010/0228798 A1 | 9/2010 | Kodama et al. |
| 2010/0262797 A1 | 10/2010 | Rosikiewicz et al. |
| 2010/0318645 A1 | 12/2010 | Hoole et al. |
| 2010/0332456 A1 | 12/2010 | Prahlad et al. |
| 2011/0026439 A1 | 2/2011 | Rollins |
| 2011/0029711 A1 | 2/2011 | Dhuse et al. |
| 2011/0034176 A1 | 2/2011 | Lord et al. |
| 2011/0060918 A1 | 3/2011 | Troncoso Pastoriza et al. |
| 2011/0106795 A1 | 5/2011 | Maim |
| 2011/0138123 A1 | 6/2011 | Gurajada et al. |
| 2011/0213754 A1* | 9/2011 | Bindal ............... G06F 11/1453 707/641 |
| 2011/0231374 A1 | 9/2011 | Jain et al. |
| 2011/0231524 A1 | 9/2011 | Lin et al. |
| 2011/0264712 A1 | 10/2011 | Ylonen |
| 2011/0264989 A1 | 10/2011 | Resch et al. |
| 2011/0271007 A1 | 11/2011 | Wang et al. |
| 2012/0011337 A1 | 1/2012 | Aizman |
| 2012/0030260 A1 | 2/2012 | Lu et al. |
| 2012/0030408 A1 | 2/2012 | Flynn et al. |
| 2012/0047181 A1 | 2/2012 | Baudel |
| 2012/0060072 A1 | 3/2012 | Simitci et al. |
| 2012/0078915 A1 | 3/2012 | Darcy |
| 2012/0096217 A1 | 4/2012 | Son et al. |
| 2012/0147937 A1 | 6/2012 | Goss et al. |
| 2012/0173790 A1 | 7/2012 | Hetzler et al. |
| 2012/0179808 A1 | 7/2012 | Bergkvist et al. |
| 2012/0179820 A1 | 7/2012 | Ringdahl et al. |
| 2012/0185555 A1 | 7/2012 | Regni et al. |
| 2012/0210095 A1 | 8/2012 | Nellans et al. |
| 2012/0233251 A1 | 9/2012 | Holt et al. |
| 2012/0278511 A1 | 11/2012 | Alatorre et al. |
| 2012/0290535 A1 | 11/2012 | Patel et al. |
| 2012/0290629 A1* | 11/2012 | Beaverson ........ G06F 17/30094 707/827 |
| 2012/0310892 A1 | 12/2012 | Dam et al. |
| 2012/0323850 A1 | 12/2012 | Hildebrand et al. |
| 2012/0331528 A1 | 12/2012 | Fu et al. |
| 2013/0013571 A1 | 1/2013 | Sorenson, III et al. |
| 2013/0041931 A1 | 2/2013 | Brand |
| 2013/0054924 A1 | 2/2013 | Dudgeon et al. |
| 2013/0067270 A1 | 3/2013 | Lee et al. |
| 2013/0073821 A1 | 3/2013 | Flynn et al. |
| 2013/0086004 A1 | 4/2013 | Chao et al. |
| 2013/0091105 A1 | 4/2013 | Bhave et al. |

(56) References Cited

U.S. PATENT DOCUMENTS

| | | |
|---|---|---|
| 2013/0091180 A1 | 4/2013 | Vicat-Blanc-Primet et al. |
| 2013/0162160 A1 | 6/2013 | Ganton et al. |
| 2013/0166818 A1 | 6/2013 | Sela |
| 2013/0185508 A1 | 7/2013 | Talagala et al. |
| 2013/0232313 A1 | 9/2013 | Patel et al. |
| 2013/0235192 A1 | 9/2013 | Quinn et al. |
| 2013/0246589 A1 | 9/2013 | Klemba et al. |
| 2013/0262638 A1 | 10/2013 | Kumarasamy et al. |
| 2013/0263151 A1 | 10/2013 | Li et al. |
| 2013/0268644 A1 | 10/2013 | Hardin et al. |
| 2013/0268770 A1 | 10/2013 | Hunt et al. |
| 2013/0282798 A1 | 10/2013 | McCarthy et al. |
| 2013/0288668 A1 | 10/2013 | Pragada et al. |
| 2013/0311574 A1 | 11/2013 | Lal |
| 2013/0346591 A1 | 12/2013 | Carroll et al. |
| 2013/0346839 A1 | 12/2013 | Dinha |
| 2014/0006580 A1 | 1/2014 | Raghu |
| 2014/0007178 A1 | 1/2014 | Gillum et al. |
| 2014/0059405 A1 | 2/2014 | Syu et al. |
| 2014/0143206 A1 | 5/2014 | Pittelko |
| 2014/0297604 A1* | 10/2014 | Brand ............... G06F 17/30194 707/692 |
| 2014/0335480 A1 | 11/2014 | Asenjo et al. |
| 2014/0351419 A1 | 11/2014 | Hunt et al. |
| 2014/0372490 A1 | 12/2014 | Barrus et al. |
| 2014/0379671 A1 | 12/2014 | Barrus et al. |
| 2015/0012763 A1 | 1/2015 | Cohen et al. |
| 2015/0019491 A1 | 1/2015 | Hunt et al. |
| 2015/0066524 A1 | 3/2015 | Fairbrothers et al. |
| 2015/0081964 A1 | 3/2015 | Kihara et al. |
| 2015/0106335 A1 | 4/2015 | Hunt et al. |
| 2015/0106579 A1 | 4/2015 | Barrus |
| 2015/0172114 A1 | 6/2015 | Tarlano et al. |
| 2015/0220578 A1 | 8/2015 | Hunt et al. |
| 2015/0222616 A1 | 8/2015 | Tarlano et al. |

FOREIGN PATENT DOCUMENTS

| | | |
|---|---|---|
| EP | 2834749 | 2/2015 |
| EP | 2834943 | 2/2015 |
| EP | 2989549 A1 | 3/2016 |
| EP | 3000205 A1 | 3/2016 |
| EP | 3000289 A2 | 3/2016 |
| EP | 3008647 A1 | 4/2016 |
| EP | 3011428 A1 | 4/2016 |
| EP | 3019960 | 5/2016 |
| EP | 3020259 | 5/2016 |
| EP | 3058466 A1 | 8/2016 |
| EP | 3080969 A1 | 10/2016 |
| JP | 2004252663 A | 9/2004 |
| JP | 2008533570 A | 8/2008 |
| JP | 2010146067 A | 7/2010 |
| JP | 2011095976 A | 5/2011 |
| JP | 2012048424 A | 3/2012 |
| JP | 5996088 B2 | 9/2016 |
| WO | WO2013152357 | 10/2013 |
| WO | WO2013152358 | 10/2013 |
| WO | WO2014176264 | 10/2014 |
| WO | WO2014190093 | 11/2014 |
| WO | WO2014201270 | 12/2014 |
| WO | WO2014205286 | 12/2014 |
| WO | WO2015006371 | 1/2015 |
| WO | WO2015054664 A1 | 4/2015 |
| WO | WO2015057576 A1 | 4/2015 |
| WO | WO2015088761 A1 | 6/2015 |
| WO | WO2015116863 A1 | 8/2015 |
| WO | WO2015120071 A2 | 8/2015 |

OTHER PUBLICATIONS

Non-Final Office Action, Jun. 29, 2015, U.S. Appl. No. 14/055,662, filed Oct. 16, 2013.
Non-Final Office Action, Aug. 11, 2015, U.S. Appl. No. 14/171,651, filed Feb. 3, 2014.
International Search Report dated Apr. 2, 2015 6340PCT Application No. PCT/US2014/045822.
International Sesarch Report dated May 14, 2015 6450PCT Application No. PCT/US2015/013611.
International Sesarch Report dated May 15, 2015 6341PCT Application No. PCT/US2015/014492.
Invitation pursuant to Rule 63(1) dated May 19, 2015 5847EP Application No. 13772293.0.
Extended European Search Report dated Aug. 4, 2015 5901EP Application No. 13771965.4.
Dabek et al. "Wide-area cooperative storage with CFS", Proceedings of the ACM Symposium on Operating Systems Principles, Oct. 1, 2001. pp. 202-215.
Stoica et al. "Chord: A Scalable Peer-to-peer Lookup Service for Internet Applications", Computer Communication Review, ACM, New York, NY, US, vol. 31, No. 4, Oct. 1, 2001. pp. 149-160.
International Search Report dated Aug. 6, 2013 5901PCT Application No. PCT/US2013/035675.
Huck et al. Architectural Support for Translation Table Management in Large Address Space Machines. ISCA '93 Proceedings of the 20th Annual International Symposium on Computer Architecture, vol. 21, No. 2. May 1993. pp. 39-50.
International Search Report dated Aug. 2, 2013 5847PCT Application No. PCT/US2013/035673.
International Search Report dated Sep. 10, 2014 6362PCT Application No. PCT/US2014/035008.
Askitis, Nikolas et al., "HAT-trie: A Cache-conscious Trie-based Data Structure for Strings".
International Search Report dated Sep. 24, 2014 6342PCT Application No. PCT/US2014/039036.
International Search Report dated Oct. 22, 2014 6360PCT Application No. PCT/US2014/043283.
International Search Report dated Nov. 7, 2014 6361PCT Application No. PCT/US2014/042155.
International Search Report dated Jan. 1, 2015 6359PCT Application No. PCT/US2014/060176.
International Search Report dated Feb. 24, 2015 6359PCT Application No. PCT/US2014/060280.
International Search Report dated Mar. 4, 2015 6337PCT Application No. PCT/US2014/067110.
Extended European Search Report dated Aug. 20, 2015 5847EP Application No. 13772293.0.
Office Action dated Mar. 15, 2016 in Japanese Patent Application No. 2015-504769 filed Apr. 8, 2013.
Joao, Jose et al., "Flexible Reference-Counting-Based Hardware Acceleration for Garbage Collection," Jun. 2009, ISCA '09: Proceedings of the 36th annual internaltional symposium on Computer Architecture, pp. 418-428.
Office Action dated Mar. 29, 2016 in Japanese Patent Application No. 2015-504768 filed Apr. 8, 2013, pp. 1-16.
Notice of Allowance dated Jul. 26, 2016 for Japanese Patent Application No. 2015-504768 filed Apr. 8, 2013, pp. 1-4.
Final Office Action, Nov. 27, 2015, U.S. Appl. No. 13/441,592, filed Apr. 6, 2012.
Advisory Action, Feb. 19, 2016, U.S. Appl. No. 13/441,592, filed Apr. 6, 2012.
Final Office Action, Nov. 27, 2015, U.S. Appl. No. 14/171,651, filed Feb. 3, 2014.
Final Office Action, Nov. 20, 2015, U.S. Appl. No. 14/055,662, filed Oct. 16, 2013.
Advisory Action, Jan. 29, 2016, U.S. Appl. No. 14/055,662, filed Oct. 16, 2013.
Office Action, Dec. 10, 2015, U.S. Appl. No. 13/939,106, filed Jul. 10, 2013.
Non-Final Office Action, Jan. 11, 2016, U.S. Appl. No. 14/284,351, filed May 21, 2014.
Advisory Action, Jan. 12, 2016, U.S. Appl. No. 14/171,651, filed Feb. 3, 2014.
Office Action, Mar. 15, 2016, U.S. Appl. No. 14/171,651, filed Feb. 3, 2014.
Office Action, Apr. 21, 2016, U.S. Appl. No. 14/105,099, filed Dec. 12, 2013.

(56) References Cited

OTHER PUBLICATIONS

Extended European Search Report dated Aug. 19, 2016 for European Application No. 14788630.3 filed Apr. 22, 2014, pp. 1-7.

* cited by examiner

REFERENCE COUNTER INTEGRITY CHECKING

CROSS-REFERENCE TO RELATED APPLICATIONS

The present application claims benefit of U.S. provisional application No. 61/815,215, filed on Apr. 23, 2013. The disclosure of the aforementioned application is incorporated herein by reference for all purposes.

TECHNICAL FIELD

This disclosure relates generally to data processing and, more specifically, to reference counter integrity checking.

BACKGROUND

The approaches described in this section could be pursued but are not necessarily approaches that have previously been conceived or pursued. Therefore, unless otherwise indicated, it should not be assumed that any of the approaches described in this section qualify as prior art merely by virtue of their inclusion in this section.

In computer systems, data stored in Random Access Memory (RAM), a hard disk drive (HDD), or some other data storage device is usually organized as objects having references referring to these objects. An object may have many references that point to it, and conversely, the object itself may include references that point to other objects.

In order to effectively utilize the resources of a computer memory and hard disk storage devices, it is important to know whether a given object has any references referring to it. If there are no references referring to the object, then it means that the object is no longer used and, therefore, can be removed from the object database and the space in a computer memory or a hard disk storage used by the object can be labeled as unoccupied and used by new data objects.

Some computer systems can use simple reference counting techniques to track how many references are referring to a given object. Each time a new reference is added to an object, the reference counter associated with the object is incremented by one, and correspondingly, each time a reference referring to the given object is removed, the reference counter is decremented by one. If a stored value for the reference counter of an object ever reaches zero, the object can be freed, and if the object is referencing other objects, their reference counters can be decremented in turn. Thus, deletion of one object can cause a recursive cascade of freed objects and widespread decrementing of reference counts. Accordingly, an incorrect count of references can result in massive data loss due to reference counters of objects becoming zero and deletion of the objects.

Several situations can lead to incorrect reference counts (for example, a counter is not properly incremented but subsequently decremented, a counter of the same reference is decremented more than once, a counter of a wrong objected is decremented, or the reference counter is corrupted). These errors can be caused by both data corruptions and software bugs, which are always a possibility. Therefore, additional measures preventing accidental deletion of an object due to an incorrect reference counter should be undertaken.

SUMMARY

This summary is provided to introduce a selection of concepts in a simplified form that are further described in the Detailed Description below. This summary is not intended to identify key features or essential features of the claimed subject matter, nor is it intended to be used as an aid in determining the scope of the claimed subject matter.

The technique disclosed herein relates to checking of the integrity of reference counting. A conventional reference counting involves incrementing the reference counter of an object by one when a new reference referring to the object is added and decrementing the reference counter by one when an existing reference referring to the object is deleted.

Theoretically, a method for checking of the consistency of the reference counting described herein can be implemented as the following. It would be simple to check the reference counter if a full list of all references referring to the object is recorded and kept during the lifetime of the object. The list would include a unique identifier associated with each reference. Adding a reference would increment the reference counter and record the unique identifier associated with this reference. When decrementing the reference counter, the software would provide the identifier of the reference being removed. Thus, every time a new reference to the object is about to be removed, it would be simple to determine whether the list already contains the corresponding identifier, and based on the determination, decide whether to decrement the reference counter, or whether this decrement cannot be matched with an increment, which indicates an error, software bug, or corruption.

However, the described theoretical technique for checking the integrity of reference counter is impractical because it would require significant additional storage space and computation time due to the lists of unique identifiers of the references being variable.

In some embodiments, a technique involving keeping the list of identifiers of the references can be approximated with a calculation of a fixed size value generated mathematically in such a way that identifiers can be added or removed in any order, and once all identifiers have been removed this fixed size identifier will return to the initial value.

The unique identifiers can be generated by various hash functions. It is desirable, but not strictly required, that the hash function results in a unique identifier for each reference. Hash functions that cannot make this guarantee simply lose some precision, and may introduce some ambiguity in determining which reference is in error, while still being useful to help determine the root cause of the software bug.

It should be noted that in any case, a data corruption of the fixed size check value could result in ambiguity.

In some embodiments, the hash functions are cryptographic hashes, such as SHA1, SHA3. In other embodiments, the hash functions may include Tiger, which is a cryptographic hash function for efficiency on 64-bit platforms. The size of a Tiger hash value is 192 bits. Truncated versions (known as Tiger/128 and Tiger/160) can be used for compatibility with protocols assuming a particular hash size. Unlike the SHA family, no distinguishing initialization values are defined because they are simply prefixes of the full Tiger/192 hash value.

When storing the full size hash is too expensive in terms of compute time or available memory, a sample of the hash value may be used to compress the hash value into a shorter number, with some loss of precision in guaranteeing the uniqueness of the identifier. For example, when SHA1 is used as a hash function, it results in 160 bit identifiers. Compressing the SHA1 value to a computer's native size type, such as 64 bits, results in faster computations. Compression can take on various forms, such as taking the 64 bit prefix or suffix or any other mathematical function applied to the hash value In some embodiments, identifiers are 64 bit prefixes of SHA1 hashes, and these identifiers are added to the check value when the reference counter is incremented, and subtracted when the reference counter is decremented. (NOTE: "added" and "subtracted" here means the precise mathematical definition of addition and subtraction).

BRIEF DESCRIPTION OF THE DRAWINGS

Embodiments are illustrated by way of example, and not by limitation, in the figures of the accompanying drawings, in which like references indicate similar elements.

DETAILED DESCRIPTION

Figure 1:
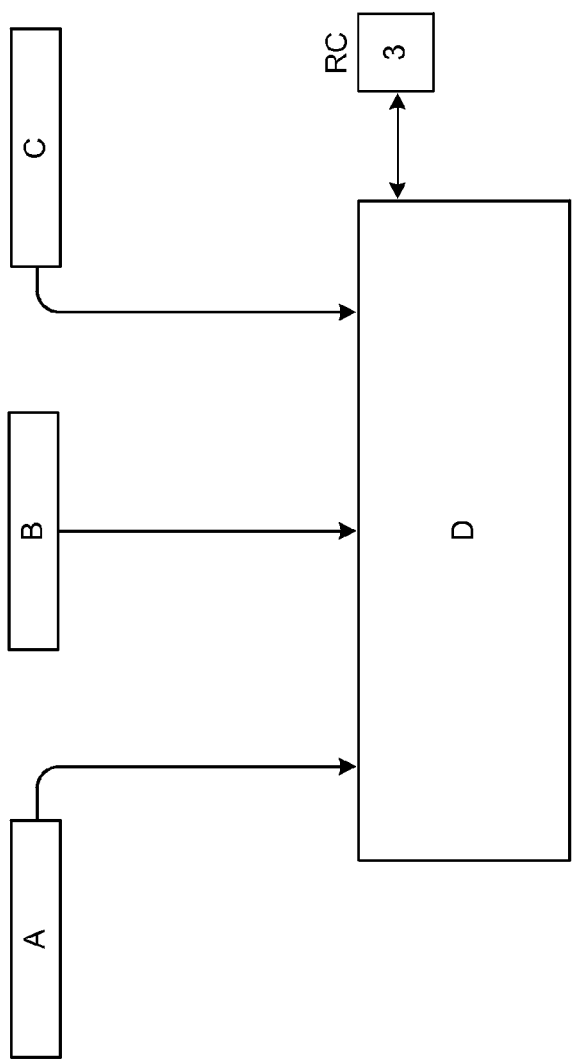
FIG. 1 shows an example data object, references referring to the object, and a correct reference counter associated with the object.

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is therefore not to be taken in a limiting sense, and the scope is defined by the appended claims and their equivalents. In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated.

The techniques of the embodiments disclosed herein may be implemented using a variety of technologies. For example, the methods described herein may be implemented in software executing on a computer system or in hardware utilizing either a combination of microprocessors or other specially designed application-specific integrated circuits (ASICs), programmable logic devices, or various combinations thereof. In particular, the methods described herein may be implemented by a series of computer-executable instructions residing on a storage medium such as a disk drive, or computer-readable medium. It should be noted that methods disclosed herein can be implemented by a computer (e.g., a desktop computer, tablet computer, laptop computer), game console, handheld gaming device, cellular phone, smart phone, smart television system, and so forth.

The technology described herein relates to tracking a reference counter associated with a data object in a file system. In various embodiments, the method for checking the integrity of the reference counter may include associating a reference check with the object. The reference check is set to a predefined initial value before any references referring to the object are added. The method may continue with associating a unique identifier with each reference referring to the object. The method may proceed with determining a pair of binary operations of adding and subtracting the identifier associated with the reference to the reference check associated with the object. When a new object reference referring to the object is added, the method may include increasing, by one, the reference counter and adding a unique identifier associated with the new reference to the reference check. When an existing reference referring to the object is being removed, the method may include decreasing by one the reference counter of the object and subtracting a unique identifier associated with the existing reference from the reference check. The method may further proceed with determining whether the reference counter is zero. If the reference counter is equal to zero, the method may allow for determining whether the reference check is equal to the predefined initial value. If the reference check is not equal to the predefined initial value while the reference counter is zero, the method may include with sending an error message to the file system.

There is a reference counter associated with the object during the lifetime of a data object in a file system. The counter indicates how many other objects in the file system are referring to this object. FIG. 1 shows an example 100 of data object D and three references A, B, and C referring to the object D. The reference counter RC associated with object D is equal to three.

Figure 2:
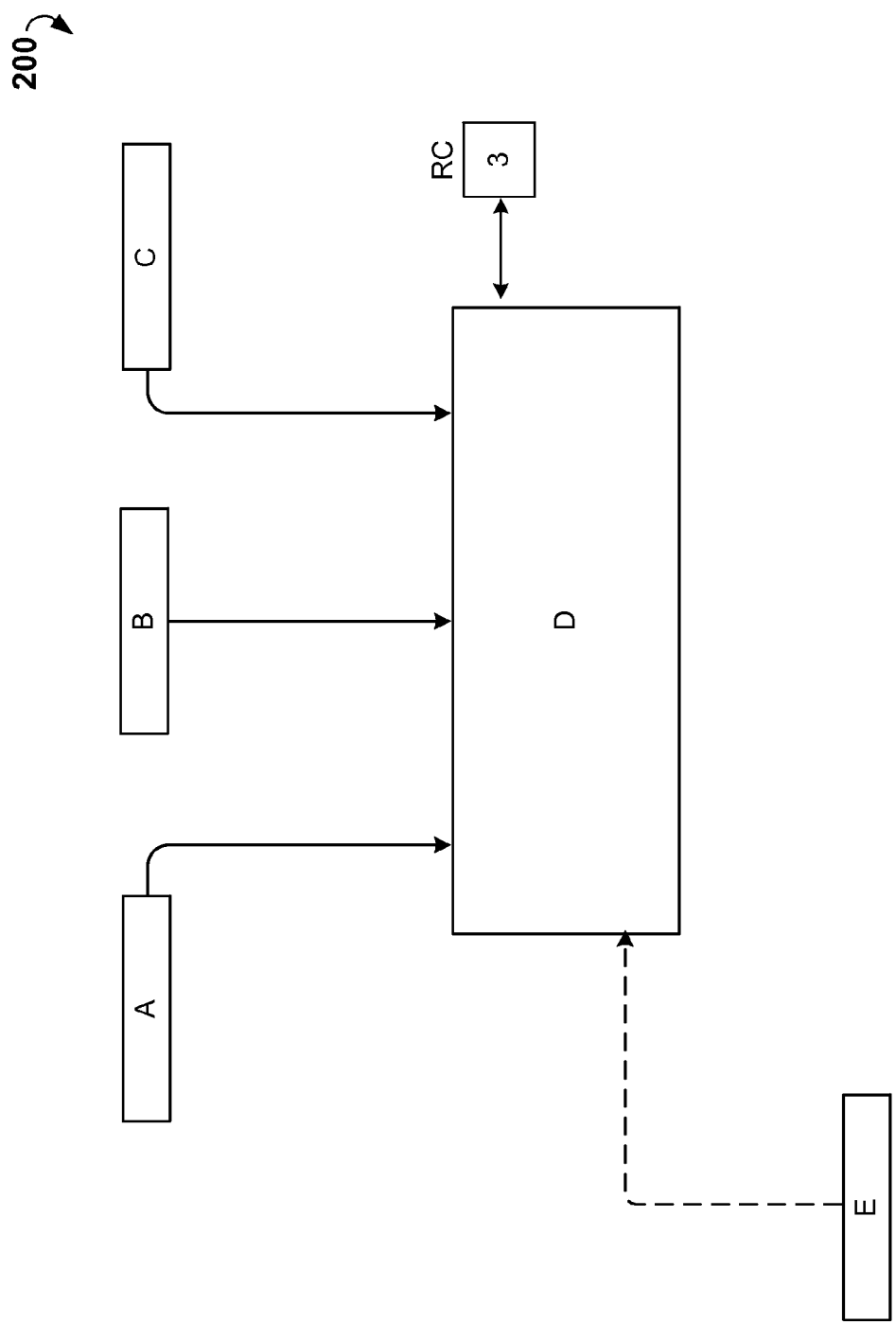
FIG. 2 shows an example data object, references referring to the object, and an incorrect reference counter associated with the object.

Due to some file system failures (for example, inconsistent stops and starts of the computer or software bugs), the reference counter of the data object can be incorrect. In some situations it could hold a number which is less than the number of the references referring to the object. An example 200 of inconsistency in a reference counter is shown in FIG. 2, wherein four references A, B, C, and E are referring to the object D; however, the reference counter associated with object D is equal to three rather than four because there was a failure to add a reference for object E. This means that if the references A, B, and C are removed, the reference counter will be zero and object D can be freed from the object store. This will leave object E unable to access D, but that object also is the one that never added its reference. However, if object E mistakenly tried to remove its reference, prior to the object being freed, this would result in a data loss for A, B, or C. For instance, if A and B removed their references, bringing the reference counter to 1, and then E removed its reference, which was mistakenly never added, this would leave the reference count at 0, and D would be freed, even though C still has a reference, and even though C correctly added its reference first. Thus in the absence of a reference check, object C is being penalized with data loss for a mistake made by object E.

Figure 3:
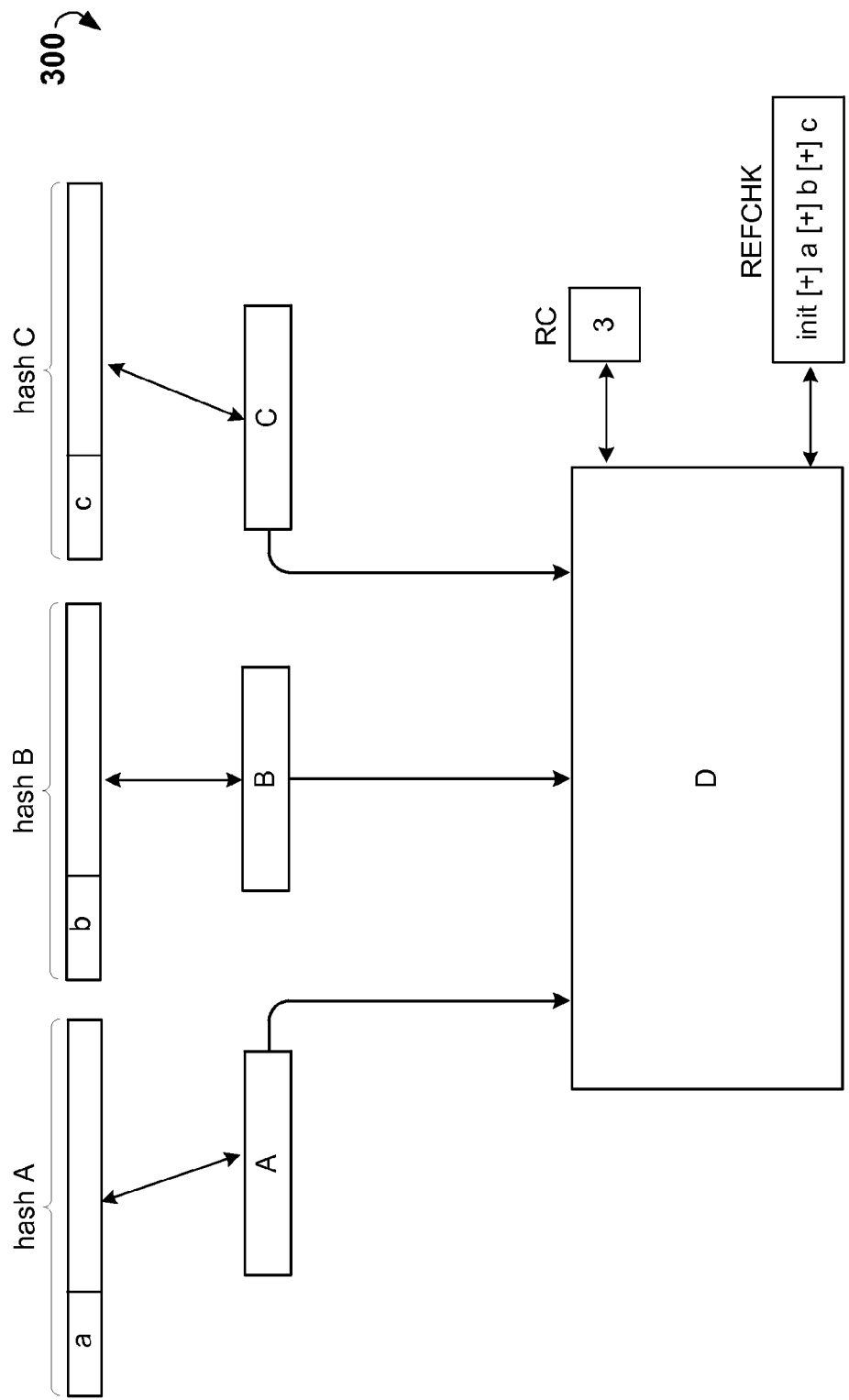
FIG. 3 shows an example data object, references referring to this object, hashes of the references, sources of the hashes, a reference counter, and a reference check associated with the object.

As shown in an example 300 in FIG. 3, an additional parameter called a reference check (or REFCHK) can be associated with each data object in the file system. In example of FIG. 3, a data object D is referenced by references A, B, and C. The reference counter RC associated with object D is equal to three. Each reference (A, B, and C) referring to the object D has a unique identifier (hash A, hash B, and hash C), which is called the "object identifier" or the "hash." The reference check of the object D can be calculated based on parts of the reference object identifiers called sources of identifier. In certain embodiments, the object identifiers and other references can be 20 bytes in length. In various embodiments, the unique object identifiers can be generated by various hash functions. In some embodiments, the hash functions are cryptographic hashes, such as SHA1, SHA3. In other embodiments, the hash functions may include Tiger, a cryptographic hash function for efficiency on 64-bit platforms. In certain embodiments, the source of the identifier can be 64 bits in length. In some embodiments, the source of the identifier can be obtained by compressing the object identifier. In certain embodiments, the source of identifier can be defined as the first 64 bits of the object identifier.

The reference check for an object that has no references referring to it is assumed to be equal to a predefined initial value init.

In some embodiments, an adding binary operation [+] can be introduced for a set of the sources in order to define a calculation of the reference check. The adding operation must have associative and commutative properties; in other words, for any sources a, b, and c, the following must be true:

$$(a[+]b)[+]c=a[+](b[+]c),$$

$$a[+]b=b[+]a.$$

The adding operation is paired with a subtracting operation [−]. The subtracting operation [−] is defined by the following set of equations for any sources a, b, and c:

$$a[+]b=c,$$

$$c[-]b=a.$$

In some embodiments, the regular integer number addition and subtraction operations can be used as a pair of binary operations to define the computation method of a reference check. In other embodiments, a logical XOR operation can serve as both an adding and subtracting operation.

Due to the associative and commutative properties of the adding binary operation used to modify the reference check, the value of the reference counter does not depend on the order in which the sources have been added or subtracted.

At least in one special case, when there is only one reference referring to the object, the source of the reference can be identified using the reference check associated with the object. Through global analysis of the set of all possible referrers, it is possible to extend this to two or more referring objects by computing the reference check combinations.

Figure 4:
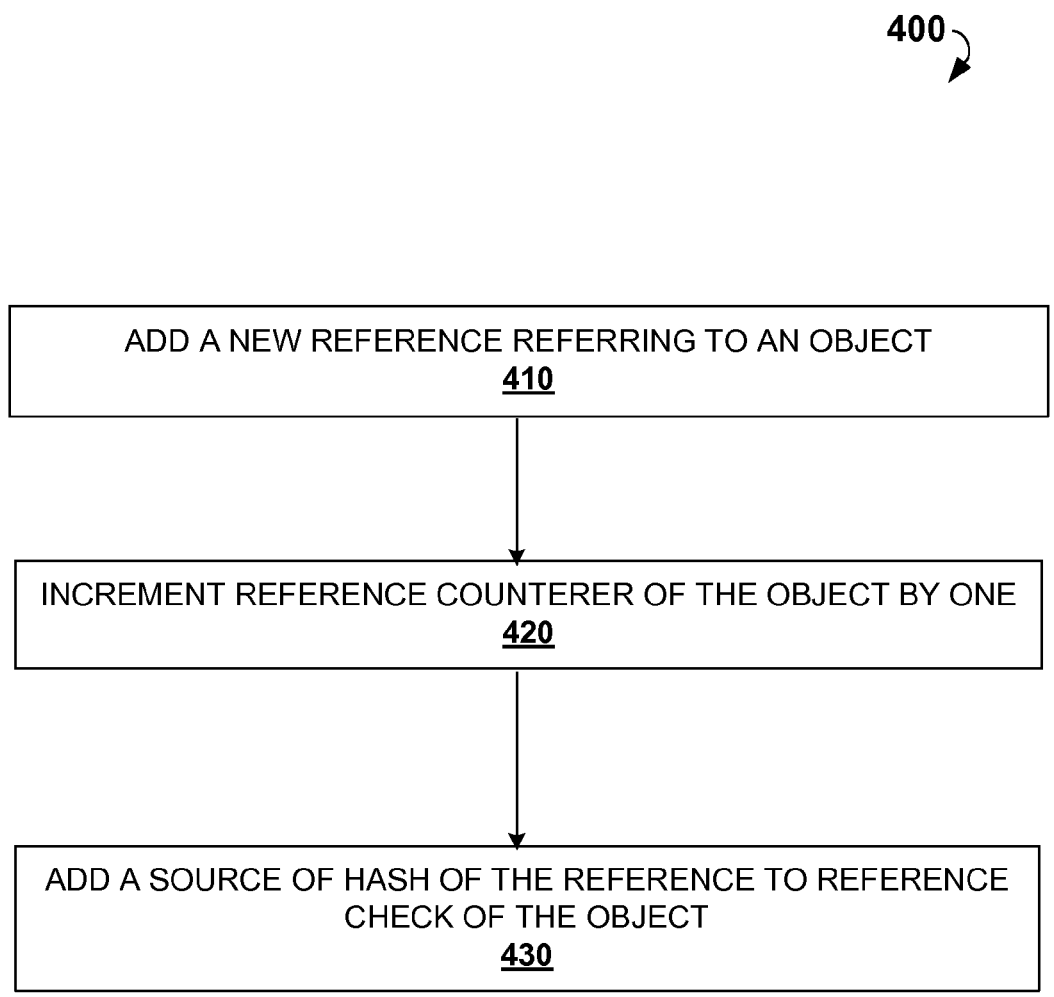
FIG. 4 is a process flow diagram illustrating a method for changing a reference counter and a reference check associated with an object after a new reference referring to the object is added.

FIG. 4 is a process flow diagram showing a method 400 of changing a reference counter and a reference check value associated with an object after a reference referring to the object is added, according to an example embodiment. Every time a new reference referring to the object is added in step 410, the reference counter associated with the object is increased by one in step 420. In step 430, the reference check is set as a result of an adding binary operation applied to the old value of the reference check and a source of the hash of the reference is added.

Figure 5:
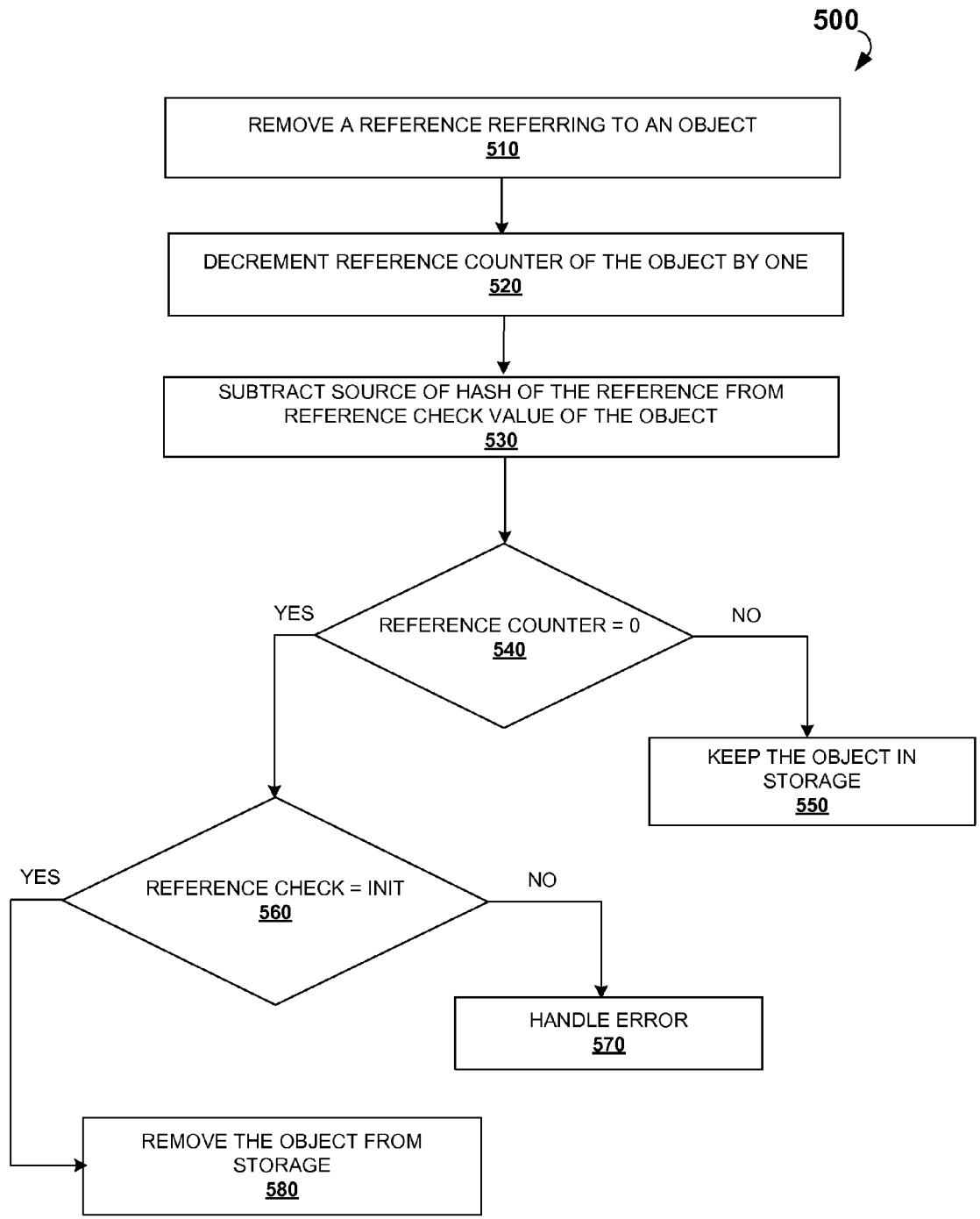
FIG. 5 is a process flow diagram illustrating a method for changing a reference counter and a reference check associated with an object after an existing reference referring to the object is removed.

FIG. 5 is a process flow diagram showing a method 500 of changing a reference counter and a reference check value associated with an object after an existing reference referring to the object is removed, according to an example embodiment. Every time a reference referring to the object is removed in step 510, the reference counter associated with the object is decreased by one in step 520. In step 530, the source of the reference is subtracted from the reference check using a subtracting binary operation.

In step 540, the method 500 may proceed with checking whether the reference counter of the object is zero. If the reference counter of the object is not zero, the object is kept in the object store in step 550. If the reference counter is zero, then an additional test involving the reference check can be performed in step 560 before deleting the object from the object store. If the reference check is equal to a predefined initial value init while the reference counter is zero, the object can be safely released from the object store in step 580.

If reference counter is zero and an additional test shows that the reference check is not equal to init, it indicates that the reference counter is broken and, in step 570, a corresponding error message is sent to the file system.

In some embodiments it would be convenient to add and remove a set of references referring to an object all at once rather than adding and removing them individually. In such a case, a single source can be assigned to the set of the references and only one adding or subtracting operation will be needed to modify the reference counter and the reference check associated with the object.

Figure 6:
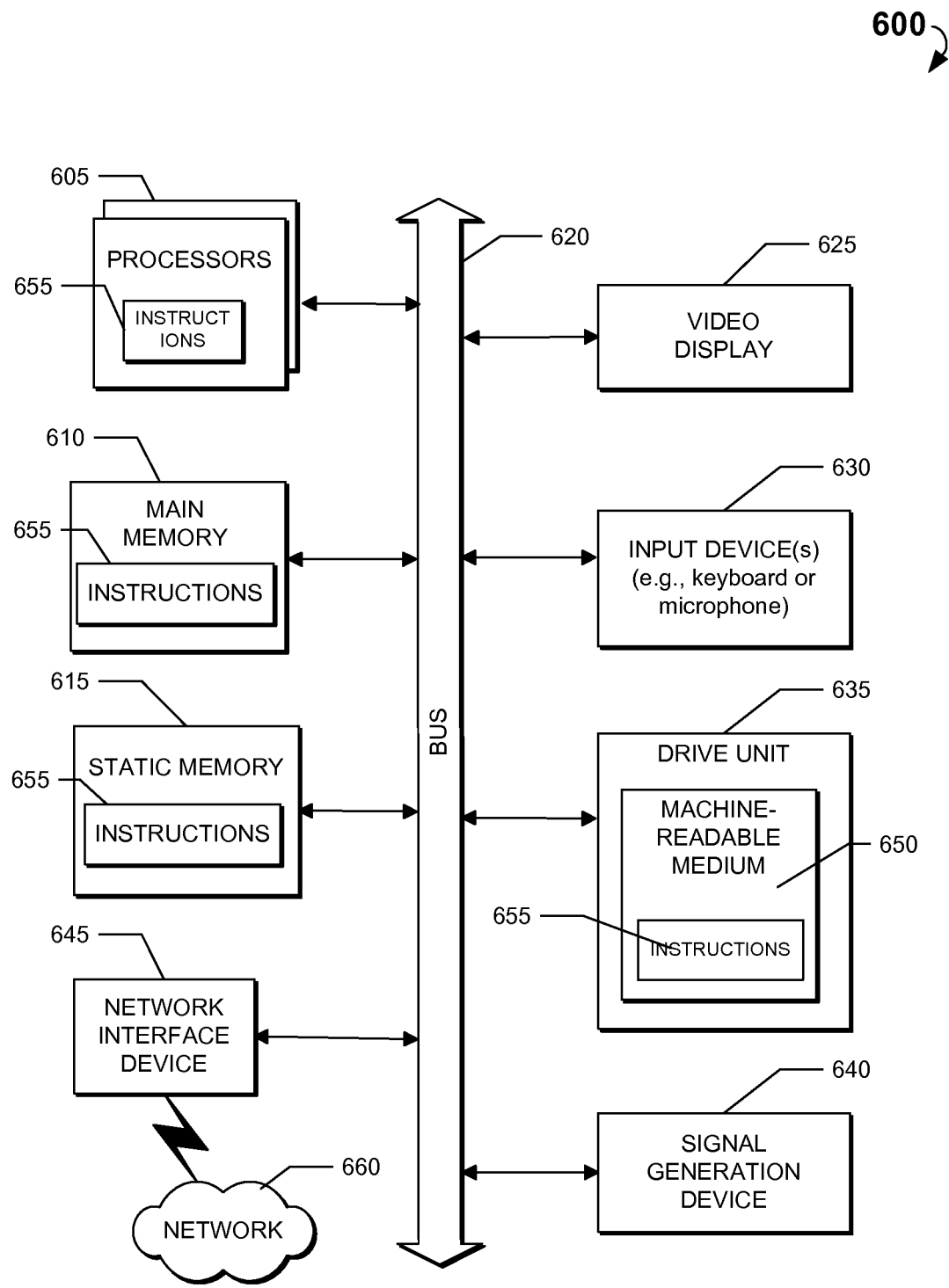
FIG. 6 shows a diagrammatic representation of a computing device for a machine in the example electronic form of a computer system, within which a set of instructions for causing the machine to perform any one or more of the methodologies discussed herein can be executed.

FIG. 6 shows a diagrammatic representation of a computing device for a machine in the example electronic form of a computer system 600, within which a set of instructions for causing the machine to perform any one or more of the methodologies discussed herein can be executed. In various example embodiments, the machine operates as a standalone device or can be connected (e.g., networked) to other machines. In a networked deployment, the machine can operate in the capacity of a server or a client machine in a server-client network environment, or as a peer machine in a peer-to-peer (or distributed) network environment. The machine can be a personal computer (PC), a tablet PC, a set-top box (STB), a personal digital assistant , a cellular telephone, a portable music player (e.g., a portable hard drive audio device, such as a Moving Picture Experts Group Audio Layer 3 (MP3) player), gaming pad, portable gaming console, in-vehicle computer, smart-home computer, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 600 includes a processor or multiple processors 605 (e.g., a central processing unit (CPU), a graphics processing unit (GPU), or both), and a main memory 610 and a static memory 615, which communicate with each other via a bus 620. The computer system 600 can further include a video display unit 625 (e.g., a liquid crystal display). The computer system 600 also includes at least one input device 630, such as an alphanumeric input device (e.g., a keyboard), a cursor control device (e.g., a mouse), a microphone, a digital camera, a video camera, and so forth. The computer system 600 also includes a disk drive unit 635, a signal generation device 640 (e.g., a speaker), and a network interface device 645.

The disk drive unit 635 includes a computer-readable medium 650, which stores one or more sets of instructions and data structures (e.g., instructions 655) embodying or utilized by any one or more of the methodologies or functions described herein. The instructions 655 can also reside, completely or at least partially, within the main memory 610 and/or within the processors 605 during execution thereof by the computer system 600. The main memory 610 and the processors 605 also constitute machine-readable media.

The instructions 655 can further be transmitted or received over the network 660 via the network interface device 645 utilizing any one of a number of well-known transfer protocols (e.g., Hyper Text Transfer Protocol (HTTP), CAN, Serial, and Modbus). For example, the network 660 may include one or more of the following: the Internet, local intranet, PAN (Personal Area Network), LAN (Local Area Network), WAN (Wide Area Network), MAN (Metropolitan Area Network), virtual private network (VPN), storage area network (SAN), frame relay connection, Advanced Intelligent Network (AIN) connection, synchronous optical network (SONET) connection, digital T1, T3, E1 or E3 line, Digital Data Service (DDS) connection, DSL (Digital Subscriber Line) connection, Ethernet connection, ISDN (Integrated Services Digital Network) line, cable modem, ATM (Asynchronous Transfer Mode) connection, or an FDDI (Fiber Distributed Data Interface) or CDDI (Copper Distributed Data Interface) connection. Furthermore, communications may also include links to any of a variety of wireless networks including, GPRS (General Packet Radio Service), GSM (Global System for Mobile Communication), CDMA (Code Division Multiple Access) or TDMA (Time Division Multiple Access), cellular phone networks, GPS, CDPD (cellular digital packet data), RIM (Research in Motion, Limited) duplex paging network, Bluetooth radio, or an IEEE 802.11-based radio frequency network.

While the computer-readable medium 650 is shown in an example embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media. Such media can also include, without limitation, hard disks, floppy disks, flash memory cards, digital video disks (DVDs), RAM, read only memory (ROM), and the like.

The example embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software programs for implementing the present method can be written in any number of suitable programming languages such as, for example, Hypertext Markup Language (HTML), Dynamic HTML, Extensible Markup Language (XML), Extensible Stylesheet Language (XSL), Document Style Semantics and Specification Language (DSSSL), Cascading Style Sheets (CSS), Synchronized Multimedia Integration Language (SMIL), Wireless Markup Language (WML), Java™, Jini™, C, C++, Perl, UNIX Shell, Visual Basic or Visual Basic Script, Virtual Reality Markup Language (VRML), ColdFusion™ or other compilers, assemblers, interpreters or other computer languages or platforms.

Thus, a method for checking the integrity of a reference counter is disclosed. The technology described herein provides the ability to catch the error if a reference pointed to the object was removed. The technology described herein also provides the ability to determine if an object can be safely released from an object store if the reference counter associated with this object is zero.

Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense.

What is claimed is:
1. A method for checking integrity of a reference counter of an object in a file system, the method comprising:
 associating the reference counter with the object;
 associating a reference check with the object, the reference check being set to a predefined initial value before any references referring to the object are added;
 associating a unique identifier with each reference referring to the object;
 determining a pair of binary operations of adding and subtracting the unique identifier associated with the reference to the reference check associated with the object;
 wherein in response to a new reference referring to the object being added the method further comprises:
  increasing a reference count by one; and
  adding a unique identifier associated with the new reference to the reference check;
 wherein in response to a set of new references referring to the object being added the method further comprises:
  assigning a single identifier to the set of new references referring to the object; and
  adding the single identifier associated with the set of new references to the reference check;
 wherein in response to an existing reference referring to the object being removed the method further comprises:
  decreasing the reference count by one;
  subtracting a unique identifier associated with the existing reference from the reference check;
  determining whether the reference counter is equal to zero;
  when it is determined the reference counter is not equal to zero, the object is not deleted from a storage;
  when it is determined the reference counter is equal to zero, determine whether the reference check is equal to the predefined initial value;
  if it is determined that the reference check is equal to the predefined initial value, deleting the object from the storage; and if the reference check is not equal to the predefined initial value, sending an error message to the file system; and wherein in response to a set of new references referring to the object being removed, the method further comprises:

subtracting a single identifier from the reference check, wherein the single identifier is assigned to the set of new references referring to the object.

2. The method of claim 1, wherein the unique identifier associated with the reference referring to the object is determined by compressing a hash of the object.

3. The method of claim 2, wherein compressing the hash of the object further comprises truncating first 64 bits of the hash of the object.

4. The method of claim 2, wherein the hash of the object is determined by a hash function.

5. The method of claim 4, wherein the hash function is one of cryptographic hash functions of SHA family.

6. The method of claim 4, wherein the hash function is one of a Tiger hash function.

7. The method of claim 1, wherein the binary operation of adding has associative and commutative properties.

8. The method of claim 1, wherein the binary operation of subtracting ([31]) is defined using the binary operation of adding ([+]) by following equations:

$$a[+]b=c,$$

$$c[-]b=a,$$

for any unique identifiers a, b, and c.

9. The method of claim 1, wherein the binary operation of adding is a regular integer number addition.

10. The method of claim 1, wherein the binary operation of adding is a bitwise XOR operation.

11. A non-transitory processor-readable medium having instructions stored thereon, which when executed by one or more processors, cause the one or more processors to perform the following steps of a method for checking integrity of a reference counter of an object, the method comprising:

associating the reference counter with the object;
associating a reference check with the object, the reference check being set to a predefined initial value before any references referring to the object are added;
associating a unique identifier with each reference referring to the object;
determining a pair of binary operations of adding and subtracting the unique identifier associated with the reference to the reference check associated with the object;
wherein in response to a new reference referring to the object being added the method further comprises:
increasing a reference count by one; and
adding a unique identifier associated with the new reference to the reference check;
wherein in response to a set of new references referring to the object being added the method further comprises:
assigning a single identifier to the set of new references referring to the object; and
adding the single identifier associated with the set of new references to the reference check;

wherein in response to an existing reference referring to the object being removed the method further comprises:

decreasing the reference count by one;
subtracting a unique identifier associated with the existing reference from the reference check;
determining whether the reference counter is equal to zero;
when it is determined the reference counter is not equal to zero, the object is not deleted from a storage;
when it is determined the reference counter is equal to zero, determine whether the reference check is equal to the predefined initial value;
if it is determined that the reference check is equal to the predefined initial value, deleting the object from the storage; and
if the reference check is not equal to the predefined initial value, sending an error message to the file system; and wherein in response to a set of new references referring to the object being removed, the method further comprises:

subtracting a single identifier from the reference check, wherein the single identifier is assigned to the set of new references referring to the object.

12. The non-transitory processor-readable medium of claim 11, wherein the unique identifier associated with the reference referring to the object is determined by compressing a hash of the object.

13. The non-transitory processor-readable medium of claim 12, wherein compressing the hash of the object further comprises truncating first 64 bits of the hash of the object.

14. The non-transitory processor-readable medium of claim 12, wherein the hash of the object is determined by a hash function.

15. The non-transitory processor-readable medium of claim 14, wherein the hash function is one of cryptographic hash functions of SHA family.

16. The non-transitory processor-readable medium of claim 14, wherein the hash function is one of a Tiger hash function.

17. The non-transitory processor-readable medium of claim 11, wherein the binary operation of adding has associative and commutative properties.

18. The non-transitory processor-readable medium of claim 11, wherein the binary operation of subtracting ([−]) is defined using the binary operation of adding ([+]) by following equations:

$$a[+]b=c,$$

$$c[-]b=a,$$

for any unique identifiers a, b, and c.

19. The non-transitory processor-readable medium of claim 11, wherein the binary operation of adding is a regular integer number addition.

20. The non-transitory processor-readable medium of claim 11, wherein the binary operation of adding is a bitwise XOR operation.

* * * * *